United States Patent
Chang

[19]

[11] Patent Number: 6,077,739
[45] Date of Patent: Jun. 20, 2000

[54] METHODS FOR MANUFACTURING DRAM CAPACITORS

[75] Inventor: Ming-Lun Chang, Hsinchu, Taiwan

[73] Assignee: Winbond Electronics Corp., Hsinchu, Taiwan

[21] Appl. No.: 08/982,322

[22] Filed: Dec. 2, 1997

[30] Foreign Application Priority Data

Nov. 10, 1997 [TW] Taiwan ................................. 86116763

[51] Int. Cl.⁷ ............................................. H01L 21/8242
[52] U.S. Cl. ............................................. 438/243; 438/386
[58] Field of Search ..................................... 438/243, 244, 438/253, 386, 387, 396, 245, 248

[56] References Cited

U.S. PATENT DOCUMENTS 5,571,743  11/1996  Henkels et al. ........................ 438/241

*Primary Examiner*—Tuan H. Nguyen
*Attorney, Agent, or Firm*—Ladas & Parry

[57] ABSTRACT

According to the manufacturing method for capacitors, which characterizes in using trench technique that is usually used in DRAM processes to form multiple bottom electrodes of the capacitor in a trench's sidewall, then increase the whole surface of the capacitor and enhance the charge stored in the electrodes. The capacitance of the capacitor manufactured by this invention is double that manufactured by conventional methods. In addition, the structure of the capacitor manufactured by this invention is multiple stages; therefor the depth of trenches is less than that manufactured by conventional methods. This manufacturing method according to the invention improves many difficulties existing in conventional processes.

45 Claims, 6 Drawing Sheets

METHODS FOR MANUFACTURING DRAM CAPACITORS

BACKGROUND OF THE INVENTION

1. Field of the Invention

The present invention relates to a method for manufacturing capacitors, particularly to a method for manufacturing DRAM capacitors.

2. Description of Related Art

With the increasing of integrality of integrated circuits and the decreasing of device size, the surface of a memory cell must be narrowed down to manufacture a high density DRAM. Thus, the surfaces of electrodes storing charges are also decreased, resulting in capacitors that provide insufficient capacitance. Therefore, it is very urgent to solve the problem of insufficient capacitance. There are basically two types of conventional methods for increasing the capacitance: (1) stacked capacitors (STC), and (2) trench capacitors. The former type of capacitors usually utilize materials with high dielectric constant such as tantalum oxide ($Ta_2O_5$), barium oxide (BaO), strontium oxide (SrO), or titanium oxide in place of conventional dielectric materials such as silicon oxide nitride to decrease the thickness of the dielectric layers.

The stacked capacitor requires complex processes to form hemispherical or cylinder shaped surfaces on one electrode of the capacitor to enhance its effective surface; however, this also enhances the nonplanarity of the wafer. Moreover, the manufacturing processes for such the newly devised dielectric materials used herein are still being developed, and such the properties as leakage, thermal stability and so on need to be further improved. The advantage of the trench capacitor is that the wafer surface is much more plane after the capacitors finished. Moreover, the processes for dielectric materials used therein, such as nitride or oxidated nitride, have been well developed. However, it requires deep trenches to provide sufficient capacitance, therefore the aspect ratio could be more than 30, which increases the difficulties of etching and trench filling.

In order to overcome the disadvantages of conventional processes described above, this invention provides a modified method for manufacturing DRAM capacitors. By increasing the surface area of a storage electrode without changing the margin of a memory cell, the capacitance of a DRAM capacitor is increased. Thereby, a high density DRAM with high capacitance can be obtained.

SUMMARY OF THE INVENTION

Accordingly, one method of manufacturing DRAM capacitors is provided, which characterizes in using trench techniques to form multiple bottom electrodes of the capacitor in a trench's sidewall. Thus, the whole surface of the capacitor is increased, and thereby the charge stored in the electrode is enhanced. The capacitance of a capacitor manufactured by this invention is double that of a capacitor manufactured by conventional method. In addition, the capacitor manufactured by this invention contains multiple pillars; therefore the essential depth of a trench is less than that of a conventional manufactured trench. The difficulties of forming deep trenches in conventional processes can be prevented in the present invention.

According to the present invention, a method for manufacturing DRAM capacitors is disclosed. First, a substrate is provided, and at least one trench is formed on the substrate. Then a spacer is formed on the sidewall of the trench. Thereafter, at least one lower electrode is formed on the sidewall of the spacer within the trench. Then one dielectric layer is formed on the lower electrode. Subsequently, one upper electrode is formed on the dielectric layer.

According to the present invention, another method for manufacturing DRAM capacitors is disclosed. First, a substrate is provided and a first insulating layer is formed on the substrate. Then a second insulating layer is formed on the first insulating layer. Thereafter, a photolithography process and etching steps are applied to define the second insulating layer. The defined second insulating layer formed in step d is used as an etching mask to etch the exposed substrate. At least one trench is then formed in the substrate. A third insulating layer is formed on the second insulating layer and the trench, then the third insulating layer is etched back to form an insulating spacer for isolation on the sidewall of the trench. A first conductive layer is formed on the second insulating layer and the trench. After the first conductive layer is etched back, a conductive spacer is formed on the insulating spacer. The spacer-forming steps described above can be repeated to form multiple spacer pillars composed of connected insulating spacers/conductive spacers on the conductive spacer to provide more capacitance. Then a second conductive layer is formed on the second insulating layer and the sidewall of the multiple pillars. The trench is filled by a non-polysilicon material. Subsequently, a planarization process is applied to open the top region of the trench, then the multiple spacer pillars are exposed. The second insulating layer is removed first, then spacers formed above are removed, thereby leaving the conductive spacers and the second conductive layer located within the conductive layers to serve as a lower electrode of a capacitor. Then, a dielectric layer is formed on the surface of the surface, and a third conductive layer is formed on the dielectric layer. Finally, a photolithography process and etching steps are applied to define the third conductive layer to serve as an upper electrode of a capacitor.

BRIEF DESCRIPTION OF THE DRAWINGS

Other objects, features, and advantages of the present invention will become apparent by way of the following detailed description of a preferred but non-limiting embodiment. The description is made with reference to the accompanying drawings in which.

DESCRIPTION OF THE PREFERRED EMBODIMENT

Figure 1A:
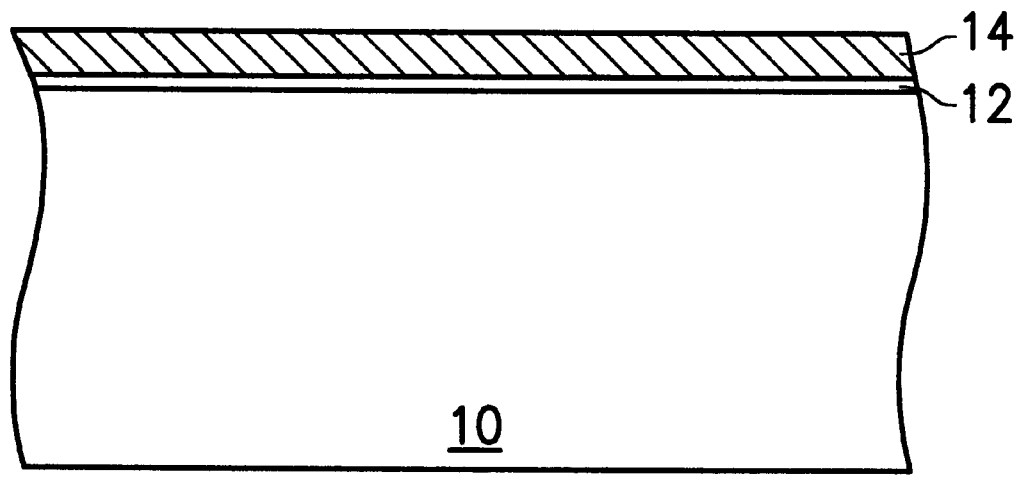
FIGS. 1A to 1M are crossing-sectional diagrams showing the manufacturing process for DRAM capacitors according to a preferred embodiment of the present invention.

First, referring to FIG. 1A, a substrate 10 is provided. An in-situ doped oxide 12 is then deposited on the substrate 10 to serve as an etching buffer layer. Then, a nitride layer 14 is deposited on the oxide 12.

Figure 1B:
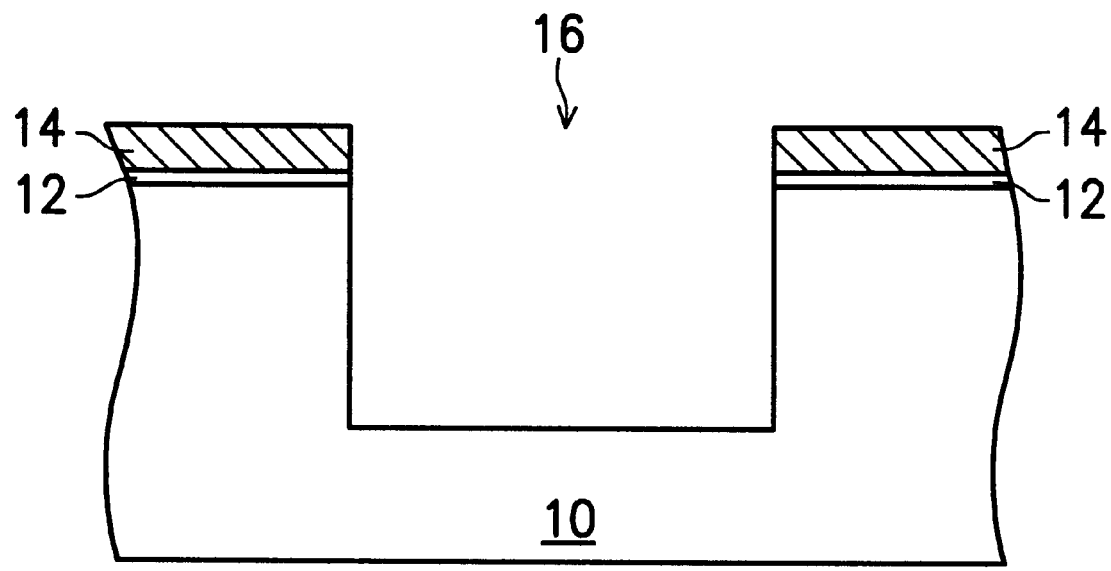

Next, referring to FIG 1B, after photolithography and etching, etching windows are formed in the substrate regions of predetermined trenches. Using nitride layer 14 as an etching mask, then an anisotropic dry etching process is applied to remove the exposed oxide layer 12 and etch down to the substrate 10 to form numerous trenches 16. The depth of the trenches could be designed according to the required capacitance; the depth is half of that of the traditional trenches, such as 3.5 $\mu$m, which can reduce the aspect ratio of the trenches. In addition, the width can be designed according to conventional trenches, for example, the width of a 256 Mb DRAM is 0.35 $\mu$m.

Next, referring to FIG. 3, an undoped oxide with a thickness 100~150 Å is formed by the conventional method, then a first spacer 18 for isolation on the sidewall of the trenches 16 is formed after etching back.

Figure 1C:
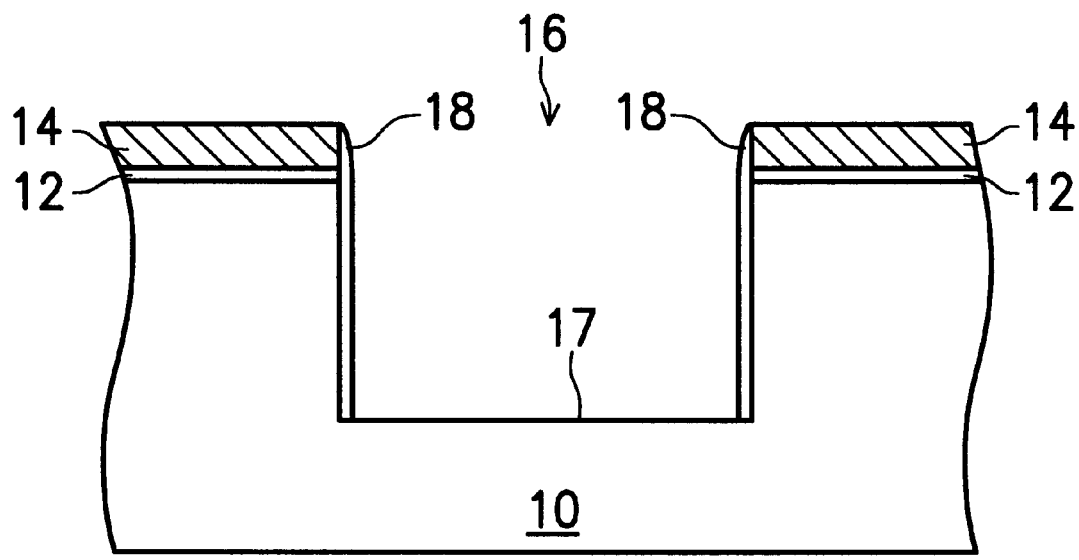
Figure 1D:
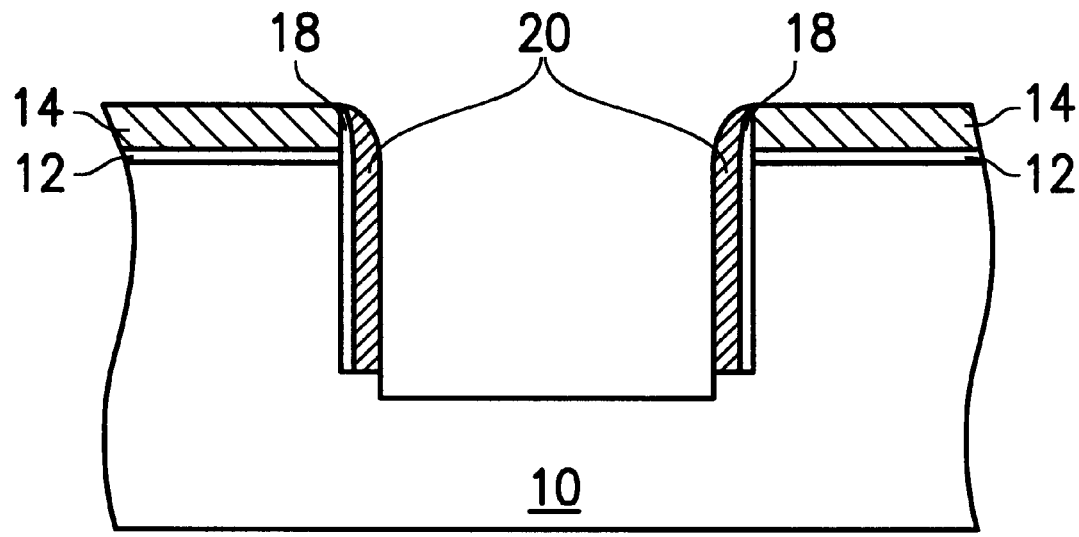

Then referring to FIG. 1C and FIG. 1D, a wet etching process is applied to remove the native oxide layer 17 on the bottom of the trenches 16. A polysilicon layer of 200~250 Å thickness is deposited on to the surface of the structure shown as FIG. 1C. Thereafter, an etching back process by the conventional method is applied to form a second spacer 20 on the sidewall of the first spacer 18. The bottom substrate 17 of the trenches 16 is not shielded by the first spacer 18, therefore the bottom substrate 17 is partially etched off during the etching back process, however, it does not cause any harm in the subsequent processes.

Figure 1E:
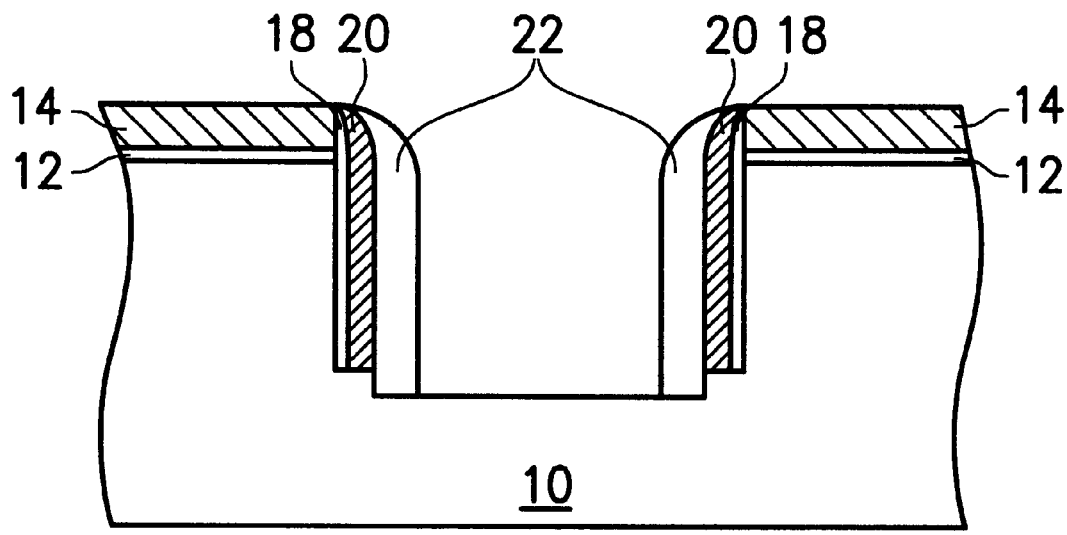
Figure 1F:
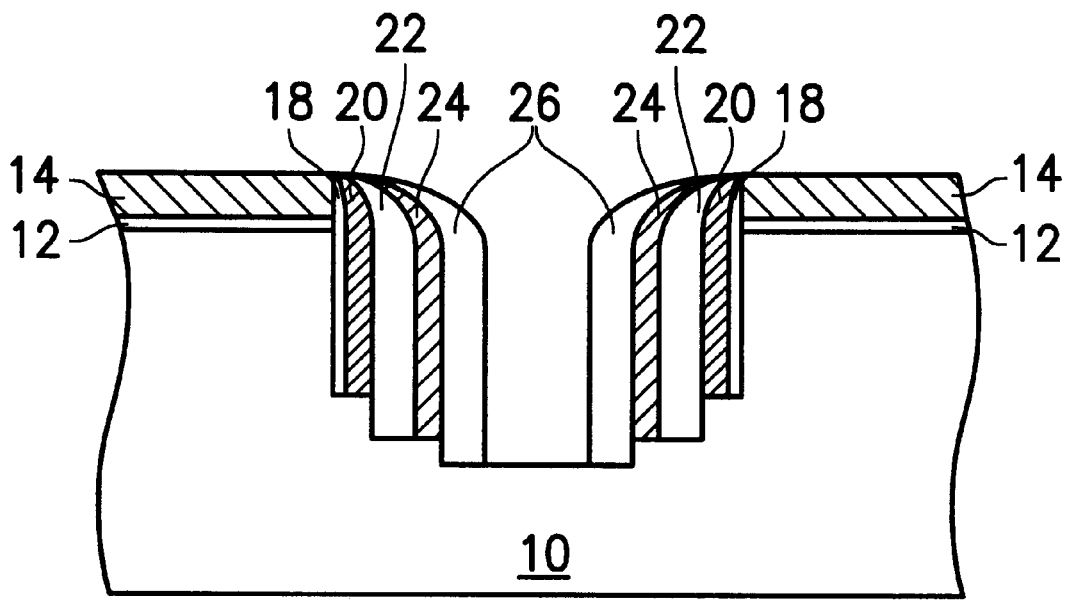

Then, referring to FIG. 1E and FIG. 1F, the processes shown in FIG. 1B~FIG. 1D are repeated, then a in-situ doped oxide with a thickness of about 350~400 Å, such as TEOS, is deposited on the surface of the structure shown in FIG. 1D. A third spacer 22 is formed on the sidewall of the second spacer 20. Then a fourth spacer 24 consisting of doped polysilicon is formed on the sidewall of the third spacer 22. In addition a fifth spacer 26 consisting of doped oxide, such as TEOS, is formed on the sidewall of the fourth spacer 24. The width of the trench with such a structure consisting of multiple spacers is about 600~900 Å.

Figure 1G:
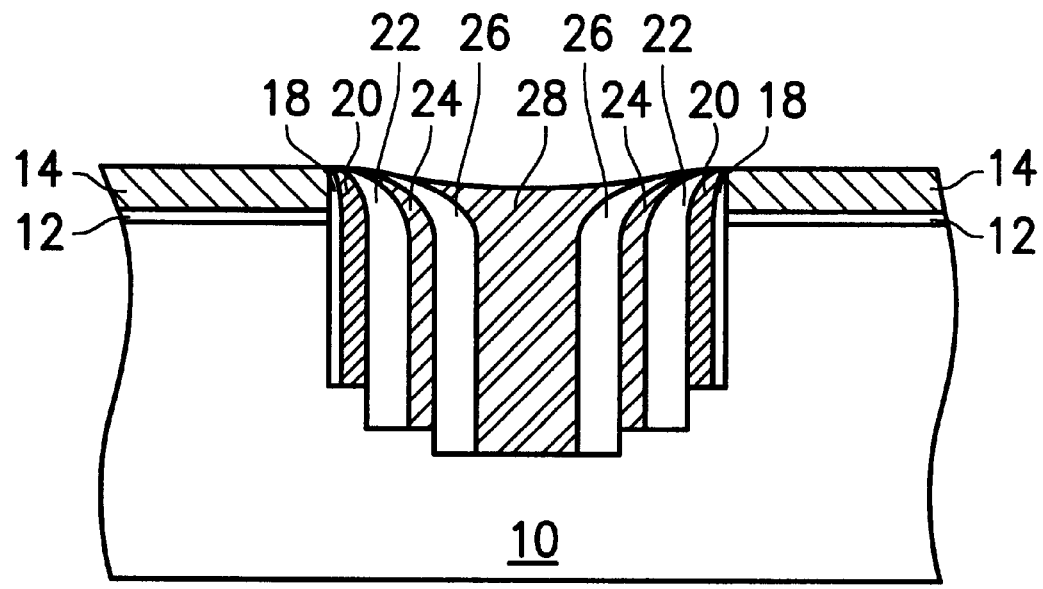

Then referring to FIG. 1G, an amorphous silicon layer is doped on the structure of the wafer shown as FIG. 1F, then etched back to form a amorphous layer 28 fully filling the trench 16.

Figure 1H:
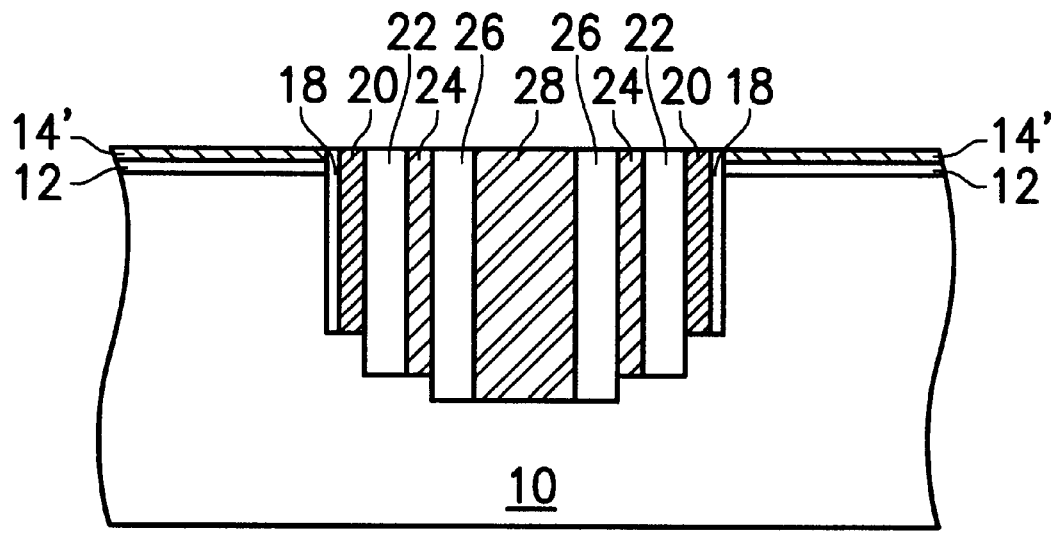

Then referring to FIG. 1H, by means of a conventional planarization process such as CMP to polish oxide layer 14 is polished, as is the top of trench 16. Then a nitride layer 14' with thinner thickness is formed and the multiple structure in trench 16 is exposed.

Figure 1I:
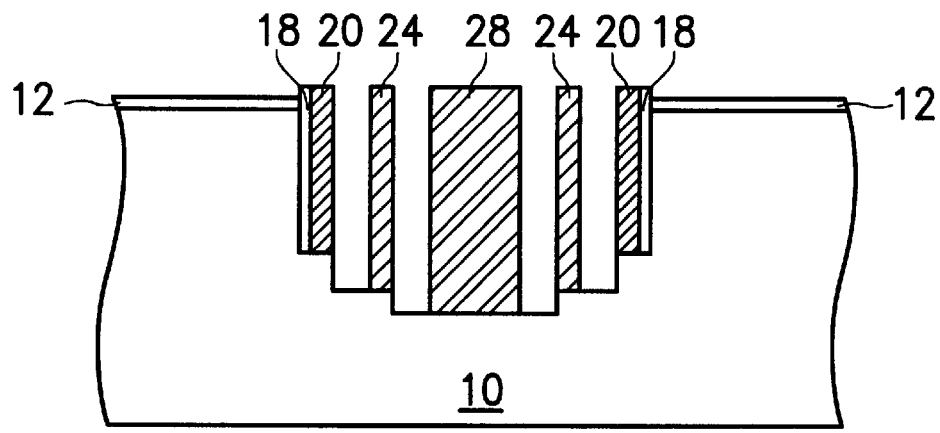

Next, referring to FIG. 1I, the nitride oxide layer 14' is removed by a conventional method.

Figure 1J:
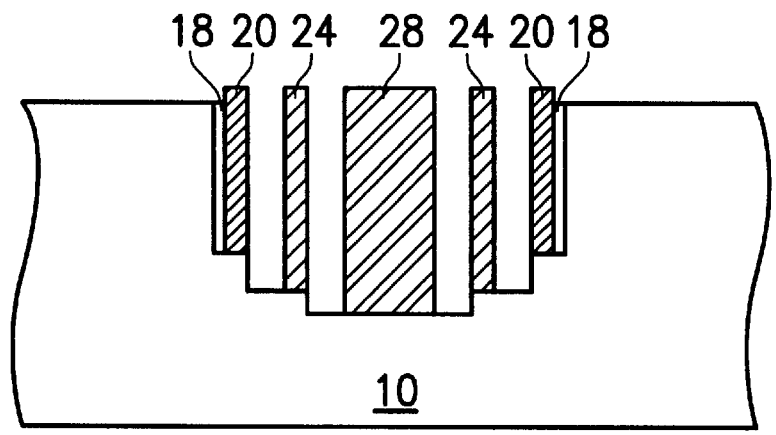

Then, referring to FIG. 1J, the in-situ doped third spacer 22 and fifth spacer 26 are removed by selective etching such as selective HF vapor etching, leaving the first spacer 18, the second spacer 20, the fourth spacer 24 and the amorphous layer 28. The second spacer 20, the fourth spacer 24 and the amorphous layer 28 are used as the bottom electrodes of the capacitor.

Figure 1K:
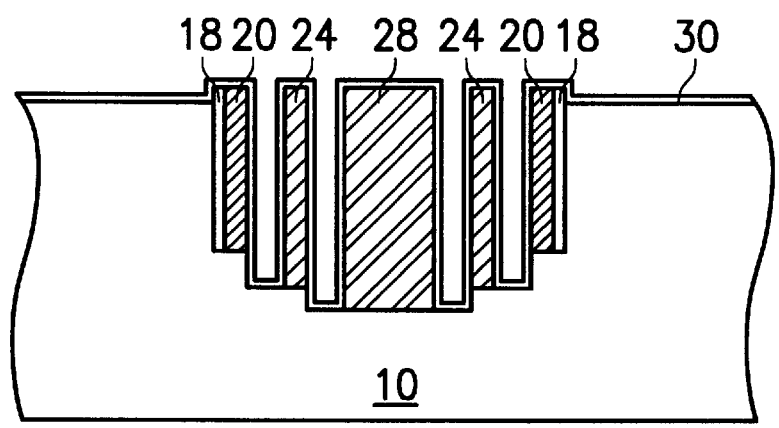

Then referring to FIG. 1K, a dielectric layer 30 with a thickness of about 60~80 Å consisting of conventional ONO materials is formed on the surfaces of the structure shown in FIG. 1J. The exposed substrate 10, the spacers 18, 20, 24 and the sidewall of the amorphous layer 28 and the bottom of trench 18 are covered by the dielectric layer 30.

Figure 1L:
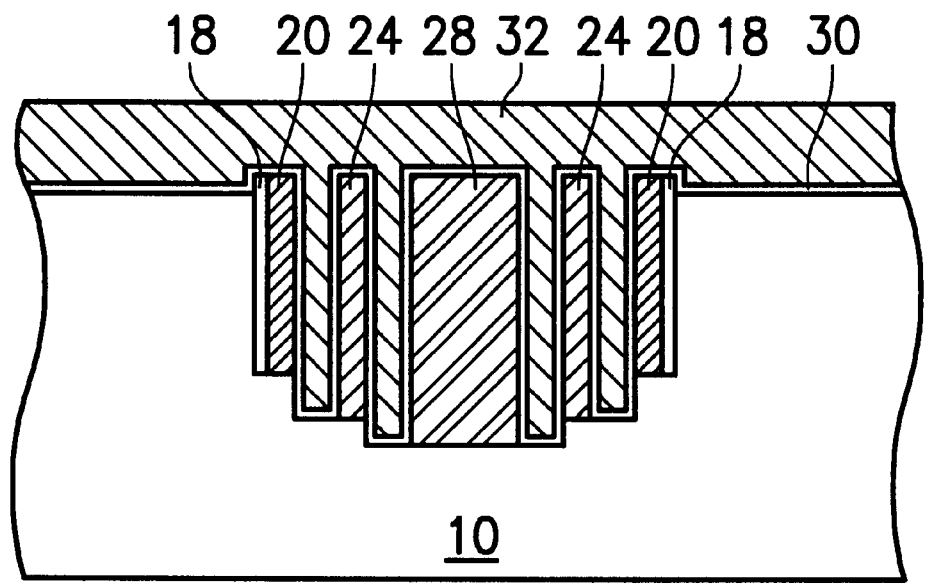

Then referring to FIG. 1L, an in-situ doped amorphous layer 32 is deposited on the surface of the structure shown in FIG. 1K, and the trench 18 is fully filled.

Figure 1M:
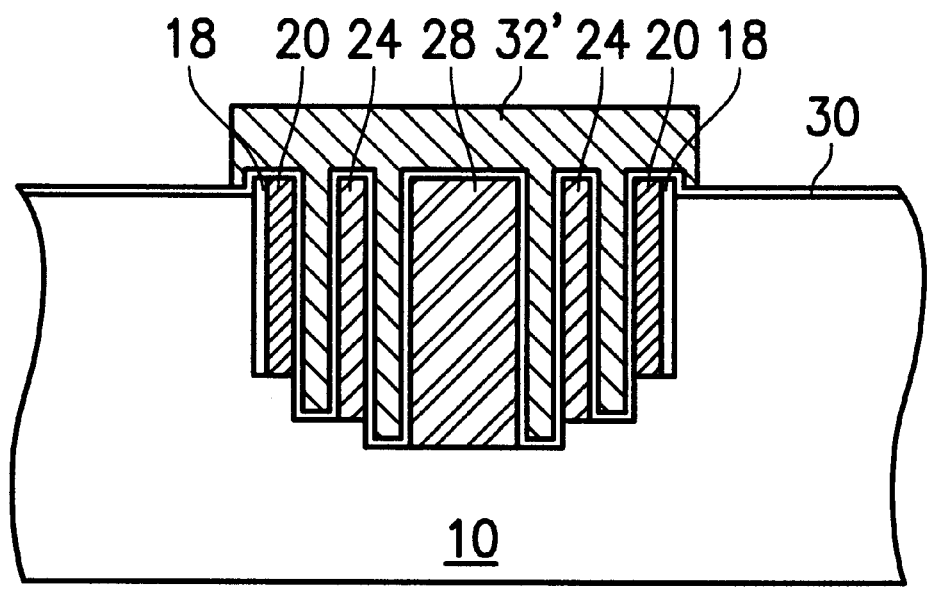

Then referring to FIG. 1M, a shaped amorphous 32' is formed on the trench 18 after photolithography and etching to serve as the upper electrode of the capacitor.

By means of this method, the trench techniques usually adopted in DRAM processes are used to form multiple bottom electrodes of the capacitor in the trench sidewalls. This both increases the whole surfaces of the capacitor and enhances the charge stored in the electrode. The capacitance of the capacitor manufactured by this invention is double that manufactured by conventional methods. In addition, the structure of the capacitor manufactured by this invention has multiple stages; therefore the width of the trench and the number of the multiple stage conductive layers can be designed for a predetermined capacitance within the allowed device size. Additionally, the depth of the trenches is less than that of conventional capacitors manufactured by conventional methods. This manufactured method according to the invention improves many problems created by conventional processes.

A preferred embodiment according to the present invention has been disclosed as above; however, this is not intended to restrict the scope of the present invention. Those who are skilled in the art can make various modifications within the scope of this present invention. Hence, the scope of the present invention is to be determined by the claims described below.

What is claimed:

1. A method for manufacturing DRAM capacitors, comprising the steps of:

(a) providing a substrate;
   (b) forming a first insulating layer onto the substrate;
   (c) forming a second insulating layer onto the first insulating layer;
   (d) using photolithography and etching steps to define the second insulating layer;
   (e) etching exposed substrate to form at least one trench in the substrate, using the defined second insulating layer formed in step (d) as an etching mask, wherein the trench has a sidewall and a bottom;
   (f) forming a third insulating layer onto the second insulating layer, the sidewall of the trench, and the bottom of the trench;
   (g) etching back the third insulating layer to form an insulating spacer for isolation on the sidewall of the trench;
   (h) forming a first conductive layer onto the second insulating layer, the sidewall and bottom of the trench;
   (i) etching back said first conductive layer to form a conductive spacer onto said insulating spacer;
   (j) repeating the steps (e) through (i) once, then forming multiple spacer pillars composed of connected insulating spacers/conductive spacers onto the conductive spacer;
   (k) forming a second conductive layer onto the second insulating layer to fill up the trench;
   (l) applying a planarization process to open a top region of the trench, exposing the multiple spacer pillars;
   (m) removing the second insulating layer;
   (n) removing the spacers formed in step (j), and leaving the conductive spacers and the second conductive layer within the conductive layers, thereby forming a lower electrode of a capacitor;
   (o) forming a dielectric layer onto a surface of the structure formed in step (n);
   (p) forming a third conductive layer onto the dielectric layer; and
   (q) using photolithography and etching steps to define the third conductive layer, thereby forming an upper electrode of a capacitor.

2. The method according to claim 1, wherein the first insulating layer comprises a doped oxide layer.

3. The method according to claim 1, wherein the second insulating layer comprises a nitride layer.

4. The method according to claim 3, wherein the third insulating layer comprises an undoped oxide layer.

5. The method according to claim 4, wherein the first conductive layer comprises a doped polysilicon layer.

6. The method according to claim 5, wherein the insulating spacers manufactured in step (j) comprise an undoped oxide layer.

7. The method according to claim 6, wherein the conductive spacers comprise an in-situ doped polysilicon layer.

8. The method according to claim 7, wherein the second conductive layer comprises an in-situ doped amorphous silicon layer.

9. The method according to claim 8, wherein said dielectric layer comprises ONO materials with a thickness of 60–80 Å.

10. The method according to claim 9, wherein the third conductive layer comprises an in-situ doped amorphous silicon layer.

11. The method according to claim 10, wherein the planarization process is performed by chemical-mechanical polishing (CMP).

12. The method according to claim 10, wherein the spacers removed in step (n) are removed by selective etching.

13. The method according to claim 12, wherein the selective etching is performed using HF as an etching gas.

14. The method according to claim 1, further comprising a high-temperature treatment after step (q).

15. The method according to claim 14, wherein said high-temperature treatment is a thermal anneal process.

16. The method according to claim 14, wherein said high-temperature treatment is a refluxing process.

17. A method for manufacturing DRAM capacitors, comprising the steps of:
 (a) providing a substrate;
 (b) forming at least a trench on the substrate;
 (c) forming a spacer on a sidewall of the trench,
 (d) forming at least lower electrode onto a sidewall of said spacer within the trench;
 (e) forming a dielectric layer onto the lower electrode; and
 (f) forming an upper electrode onto said dielectric layer;
wherein the trench comprises the sidewall of the trench and a bottom; wherein step (d) comprises depositing a conductive layer and etching back the conductive layer by an etching-back process to form the lower electrode onto the sidewall of the spacer within the trench; and wherein a portion of the bottom of the trench is partially etched off during the etching-back process.

18. A method as claimed in claim 17, wherein the lower electrode is not on said bottom portion.

19. A method as claimed in claim 18, wherein said lower electrode comprises at least one polysilicon layer and one amorphous silicon layer; wherein said upper electrode comprises amorphous silicon; and wherein said dielectric layer comprises ONO materials with a thickness of 60–80 Å.

20. A method as claimed in claim 18, wherein said dielectric layer comprises ONO materials with a thickness of 60–80 Å.

21. A method as claimed in claim 17, wherein said lower electrode comprises at least one polysilicon layer and one amorphous silicon layer; wherein said upper electrode comprises amorphous silicon; and wherein said dielectric layer comprises ONO materials with a thickness of 60–80 Å.

22. A method as claimed in claim 17, wherein said dielectric layer comprises ONO materials with a thickness of 60–80 Å.

23. A method for manufacturing DRAM capacitors, comprising the steps of:
 (a) providing a substrate;
 (b) forming at least a trench on the substrate;
 (c) forming a spacer on a sidewall of the trench;
 (d) forming at least a lower electrode into a sidewall of said spacer within the trench;
 (e) forming a dielectric layer onto the lower electrode; and
 (f) forming an upper electrode onto said dielectric layer;
wherein the spacer formed in step (c) is a first spacer; wherein step (d) comprises forming a second spacer onto the sidewall of the first spacer within the trench; and wherein step (d) further comprises:
 forming a third spacer on a sidewall of the second spacer;
 forming a fourth spacer on a sidewall of the third spacer; and
 removing the third spacer, whereby the second spacer and the fourth spacer comprise the lower electrode.

24. A method as claimed in claim 23, wherein said lower electrode comprises at least one polysilicon layer and one amorphous silicon layer; wherein said upper electrode comprises amorphous silicon; and wherein said dielectric layer comprises ONO materials with a thickness of 60–80 Å.

25. A method for manufacturing DRAM capacitors, comprising the steps of:
 (a) providing a substrate;
 (b) forming at least a trench on the substrate;
 (c) forming a spacer on a sidewall of the trench;
 (d) forming at least a lower electrode onto a sidewall of said spacer within the trench;
 (e) forming a dielectric layer onto the lower electrode; and
 (f) forming an upper electrode onto said dielectric layer;
wherein the spacer formed in step (c) is a first spacer; wherein step (d) comprises forming a second spacer onto the sidewall of the first spacer within the trench; and wherein step (d) further comprises:
 forming a third spacer on a sidewall of the second spacer;
 forming a fourth spacer on a sidewall of the third spacer;
 forming a fifth spacer on a sidewall of the fourth spacer;
 after the fifth spacer is formed, filling the trench with a conductive layer; and
 removing the third spacer and the fifth spacer by selective etching, whereby the second spacer, the fourth spacer, and the conductive layer comprise the lower electrode.

26. A method as claimed in claim 25, wherein the conductive layer fully fills the trench.

27. A method as claimed in claim 25, wherein said lower electrode comprises at least one polysilicon layer and one amorphous silicon layer; wherein said upper electrode comprises amorphous silicon; and wherein said dielectric layer comprises ONO materials with a thickness of 60–80 Å.

28. A method as claimed in claim 27, wherein the conductive layer fully fills the trench.

29. A method for manufacturing a DRAM capacitor, comprising the steps of:
 (a) providing a substrate;
 (b) forming a first insulating layer onto the substrate;
 (c) forming a second insulating layer onto the first insulating layer;
 (d) using photolithography and etching steps to define the second insulating layer;
 (e) etching exposed substrate to form at least one trench in the substrate by using the defined second insulating layer formed in step (d) as an etching mask, wherein the trench has a sidewall and a bottom;
 (f) forming a third insulating layer onto the second insulating layer, the sidewall of the trench, and the bottom of the trench;

(g) etching back the third insulating layer to form a first insulating spacer for isolation on the sidewall of the trench;

(h) forming a first conductive layer onto the second insulating layer, a sidewall of the first insulating spacer, and the bottom of the trench; and (i) etching back said first conductive layer to form a conductive spacer onto the sidewall of the first insulating spacer;

(j) forming a third spacer on a sidewall of the conductive spacer;

(k) forming a fourth spacer on a sidewall of the third spacer;

(l) applying a planarization process to open a top region of the trench, thereby exposing the first insulating spacer, the conductive spacer, the third spacer, and the fourth spacer;

(m) removing the second insulating layer;

(n) removing the third spacer, whereby the conductive spacer and the fourth spacer comprise the lower electrode;

(o) forming a dielectric layer onto the lower electrode;

(p) forming a third conductive layer onto the dielectric layer; and (q) using photolithography and etching steps to define the third conductive layer, thereby forming an upper electrode of a capacitor.

30. A method as claimed in claim 29, wherein between steps (k) and (l), the method further comprises:

forming a fifth spacer on a sidewall of the fourth spacer; and after the fifth spacer is formed, filling the trench with a second conductive layer;

wherein step (l) comprises applying a planarization process to open a top region of the trench, thereby exposing the first insulating spacer, the conductive spacer, the third spacer, the fourth spacer, the fifth spacer, and the second conductive layer; and wherein step (n) comprises removing the third spacer and the fifth spacer, whereby the conductive spacer, the fourth spacer, and the second conductive layer comprise the lower electrode.

31. A method according to claim 30, wherein the first insulating layer comprises a doped oxide layer.

32. A method according to claim 30, wherein the second insulating layer comprises a nitride layer.

33. A method according to claim 32, wherein the third insulating layer comprises an undoped oxide layer.

34. A method according to claim 33, wherein the first conductive layer comprises a doped polysilicon layer.

35. A method according to claim 34, wherein the first insulating spacer comprises an undoped oxide layer.

36. A method according to claim 35, wherein the conductive spacer comprises an in-situ doped polysilicon layer.

37. A method according to claim 36, wherein the second conductive layer comprises an in-situ doped amorphous silicon layer.

38. A method according to claim 37, wherein the dielectric layer comprises ONO materials with a thickness of 60–80 Å.

39. A method according to claim 38, wherein the third conductive layer comprises an in-situ doped amorphous silicon layer.

40. A method according to claim 39, wherein the planarization process is performed by chemical-mechanical polishing (CMP).

41. A method according to claim 39, wherein the spacers removed in step (n) are removed by selective etching.

42. A method according to claim 41, wherein the selective etching is performed using HF as an etching gas.

43. A method according to claim 30, further comprising a high-temperature treatment after step (q).

44. A method according to claim 43, wherein the high-temperature treatment is a thermal anneal process.

45. A method according to claim 43, wherein the high-temperature treatment is a refluxing process.

* * * * *